United States Patent
Siprak

(10) Patent No.: US 7,947,562 B2
(45) Date of Patent: *May 24, 2011

(54) NOISE REDUCTION IN SEMICONDUCTOR DEVICE USING COUNTER-DOPING

(75) Inventor: Domagoj Siprak, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/683,896

(22) Filed: Jan. 7, 2010

(65) Prior Publication Data

US 2010/0099231 A1    Apr. 22, 2010

Related U.S. Application Data

(63) Continuation of application No. 11/771,710, filed on Jun. 26, 2007, now Pat. No. 7,651,920.

(51) Int. Cl.
*H01L 21/331* (2006.01)

(52) U.S. Cl. ......... 438/372; 438/301; 438/302; 438/375

(58) Field of Classification Search .......... 438/301–306, 438/369–377
See application file for complete search history.

(56) References Cited

U.S. PATENT DOCUMENTS

| | | | |
|---|---|---|---|
| 5,889,315 A | 3/1999 | Farrenkopf et al. | |
| 6,180,470 B1 | 1/2001 | Aronowitz et al. | |
| 6,191,463 B1 | 2/2001 | Mitani et al. | |
| 6,194,776 B1 | 2/2001 | Amano et al. | |
| 6,838,716 B2 | 1/2005 | Asada et al. | |
| 7,651,920 B2 * | 1/2010 | Siprak | 438/372 |
| 2005/0279998 A1 | 12/2005 | Cole et al. | |
| 2008/0179695 A1 | 7/2008 | Berthold et al. | |
| 2009/0004806 A1 | 1/2009 | Siprak | |

FOREIGN PATENT DOCUMENTS

DE    102008000141 A1    8/2008

OTHER PUBLICATIONS

"U.S. Appl. No. 11/771,710 Notice of Allowance Mailed Sep. 8, 2009", 6.
"U.S. Appl. No. 11/771,710, Non-Final Office Action mailed Jan. 30, 2009", 11 pgs.
"U.S. Appl. No. 11/771,710, Non-Final Office Action mailed Aug. 1, 2008", OARN, 14 pgs.
"U.S. Appl. No. 11/771,710, Response filed Dec. 1, 2008 to Non-Final Office Action mailed Aug. 1, 2008", 15 pgs.
"U.S. Appl. No. 11/771,710, Response filed Jun. 1, 2009 to Non Final Office Action mailed Jan. 30, 2009", 14 pgs.

* cited by examiner

*Primary Examiner* — Dung A. Le
(74) *Attorney, Agent, or Firm* — Schwegman Lundberg & Woessner, P.A.

(57) ABSTRACT

One or more embodiments describe a method of fabricating a silicon based metal oxide semiconductor device, including introducing a first dopant into a first partial completion of the device, the first dopant including a first noise reducing species; and introducing a second dopant into a second partial completion of the device, the second dopant and the first dopant being opposite conductivity types.

20 Claims, 8 Drawing Sheets

US 7,947,562 B2

NOISE REDUCTION IN SEMICONDUCTOR DEVICE USING COUNTER-DOPING

RELATED APPLICATIONS

This application is a Continuation of U.S. application Ser. No. 11/771,710, filed on Jun. 29, 2007, which is incorporated herein by reference in its entirety.

TECHNICAL FIELD

Embodiments described herein relate generally to semiconductor devices and more particularly, methods of fabricating semiconductor devices having reduced noise.

BACKGROUND

Flicker noise is a dominant noise source in metal oxide semiconductor field-effect transistor (MOSFET) devices at low frequencies. In battery-driven circuits where signal-to-noise ratio cannot be improved at the cost of power consumption, a reduction of flicker noise is desired. Additionally, flicker noise deteriorates the performance of RF circuits having low frequency flicker noise being mixed and translated to higher frequencies in devices such as frequency mixers and voltage controlled oscillators. In general reduction of flicker noise can reduce consumption of power and chip area.

DETAILED DESCRIPTION

Figure 1A:
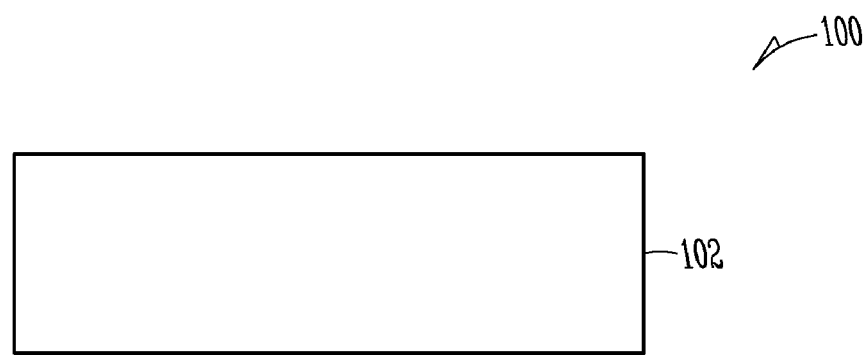
FIG. 1A-1F illustrates cross-sectional views of a partially completed semiconductor wafer at various stages of fabrication in accordance with some embodiments of the invention.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. In this document, the terms "a" or "an" are used, as is common in patent documents, to include one or more than one. In this document, the term "or" is used to refer to nonexclusive or, such that "A or B" includes "A but not B," "B but not A," and "A and B," unless otherwise indicated.

In the following description, the terms "wafer" and "substrate" may be used interchangeably to refer generally to any structure on which integrated circuits are formed and also to such structured during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The term "conductor" is understood to generally include n-type and p-type semiconductors and the term "insulator" or "dielectric" is defined to include any material that is less electrically conductive than the materials referred to as "conductors." The following detailed description is, therefore, not to be taken in a limiting sense.

The following disclosure relates in general to noise reduction in switching circuits such as RF circuits and also non switching circuits like constant bias current sources. Throughout this disclosure, the term "noise reducing dopant" or "noise reducing species" includes any impurity introduced into a layer of dielectric material to quench or passivate traps in the dielectric material and at or near the dielectric layer to substrate interface that causes trapping and emitting of charges to and from the conducting channel of a MOSFET.

Flicker noise (also known as 1/f noise) in MOSFETs occurs primarily due to the random trapping and de-trapping of charges in the oxide traps near the Si—SiO2 interface. In some embodiments, implantation of fluorine or other noise reducing dopants into the semiconductor substrate reduces the flicker noise in MOSFETs.

Semiconductor materials are easily modified by the introduction of various dopants in them. Semiconductors doped with donor impurities are called n-type, while those doped with acceptor impurities are known as p-type. The n-type and p-type designations indicate which charge carrier acts as the material's majority carrier. In CMOS devices (NMOS or PMOS), a gate voltage controls conduction between a source and a drain. The conduction along a "channel" is spaced away from the gate electrode using a gate insulator which may be formed of a dielectric material such as, for example, a silicon dioxide or a high-k dielectric material. In one or more embodiments of the invention, a gate electrode is disposed over a gate insulator to form a gate structure. The gate electrode itself may be formed as a stack of one or more conductive layers. One or more of these conductive layers, may be formed of a polysilicon, a silicide or a metal. The gate structure comprises a gate electrode overlying a gate insulator.

CMOS devices contain several types of dopants to change the electrical conductivity of the semiconductor material. The dopants may be introduced by ion implantation. Implants that may be found during the processing of a MOS device are well implants having a peak implant concentration at a depth between 250 nm to 1500 nm below the gate insulator/substrate interface. Such wells are used to isolated MOS devices electrically from each other. PMOS devices may be isolated by n-type wells in a p-type substrate. NMOS devices may be isolated from other NMOS devices by the use of a triple well made of a p-type well inside an n-type well in a p-type substrate. To lower the connection resistance to the n-type well of the triple well and so reduce substrate coupling a higher doped n-type n-band dopant can be implanted. To adjust the threshold voltage at which the MOS devices switches on, a threshold voltage adjust implant is used. For buried channel devices a buried channel stop implant is used which has its peak concentration below the peak concentration of the threshold voltage adjust implant. The peak concentrations of the threshold voltage adjust implant and buried channel stop implant extend usually not below 250 nm from the gate insulator/substrate interface. The threshold voltage adjust implant and buried channel stop implants are typically of opposite conductivity type.

After having deposited one or more of the gate electrode materials, a polysilicon predoping implant may be applied to the deposited gate electrode materials to reduce the poly gate depletion effect and lower gate resistance. After this implant step, the gate insulator material and the gate electrode materials may be etched and the gate structure may be formed. Typically, forming the gate electrode of a MOS device includes the process of etching the gate electrode materials.

To connect the channel region to the source and drain regions of the MOS device (which are formed later), shallow extension implants may be made. To control short channel effects, further halo implants may be made. After a halo implant, gate sidewall spacers may be formed. After forming the sidewall spacers, the source and drain regions of the device may be formed. The source and drain regions may be defined by introducing appropriate dopants into crystalline silicon regions. In the case of an NMOS transistor, the source and drain regions are formed using n-type dopants (which provide electrons as current carriers). In the case of a PMOS transistor, the source and the drain regions are formed using p-type dopants (which provide electron-holes as current carriers). The implants used to form the extension regions, halo regions, source and drain regions may also hit the gate structure. After the source/drain implants, at least a portion of the gate structure as well as at least a portion of the source and drain regions may be silicided.

In some embodiments, in order to improve the noise reduction function of dopants, higher concentrations of dopants are used in the semiconductor substrate. Increasing the concentration of compound dopants (e.g. $BF_2$) that contain an n-type or p-type non noise reducing species (e.g. the B in $BF_2$) and a noise reducing species (e.g. the F in BF2) will result in the increase of the concentration of the corresponding n-type or p-type concentration within the substrate. Consequently, the semiconductor substrate becomes highly conductive or leads a MOSFET with a very high threshold voltage (dependant on n-type or p-type in an NMOS or PMOS), which makes the substrate unusable. In one or more embodiments of the invention, this may be prevented by counter-doping the substrate.

Counter doping may be applied at any point in the manufacture of the device. For example, counter doping may be applied to the substrate prior to the formation of the gate insulator material (such as silicon dioxide formed by a growth process). Noise reduction by counter doping the substrate inside the MOS channel region prior to forming the gate insulator material may be attractive when, for example, metal gate electrodes are used since certain metallic materials may be a strong diffusion barrier to certain noise reducing species like fluorine.

Counter doping may be applied after the formation of the gate insulator material but before the formation of a high-k material over the gate insulator material. Certain high-k materials do not respond well to noise reducing species that are functional with the gate insulator material (such as the silicon dioxide). In such cases, the noise reducing species will be absorbed mainly in a layer (e.g. silicon dioxide) supporting the high-k material and the supporting layer formed prior to forming the high-k material. The noise reducing species is effective in this supporting layer.

One or more embodiments of the current invention provide a method of using dopants other than pure fluorine and avoids having a separate fluorine implant to be performed. This is achieved by integrating the implantation of noise reducing dopants into one or more of the processing steps of the semiconductor device by using compound dopants that contain an n-type or p-type (in general) non noise reducing species as well as a noise reducing species. Spreading the introduction of noise reducing dopants over different processing steps can lower the drawbacks of a single implant with a high dosage as e.g. crystal damage or dopant segregation in the gate insulator.

In some embodiments, counter-doping is achieved by performing a successive implantation of certain n-type and p-type noise reducing compound dopants onto the substrate. One or more of these compound noise reducing dopants may include a cation (which can be either an n-type or p-type materials) and an anion (which can be a noise reducing material such as Fluorine, Chlorine, Deuterium and Hydrogen).

In some embodiments, counter-doping allows for cancellation of the electrical conductivity resulting from the n-type and p-type materials present in the semiconductor substrate. Counter-doping as described herein prevents the accumulation of high electrical conductivity levels from a particular type (n-type or p-type) of material within the substrate. Additionally, the concentration of the noise reducing ions (such as Fluorine, Chlorine, Deuterium, Hydrogen etc) can be increased within the substrate. Moreover, the increase in the concentration of noise reducing ions within the substrate is achieved without the addition of further implantation process steps during the fabrication of the semiconductor device. Also higher amounts of fluorine can be introduced with the same dosage compared to pure fluorine implant by using compound dopants containing more than one noise reducing species. This can provide shorter processing time and so higher wafer throughput during manufacturing.

FIG. 1A-1F illustrate cross-sectional views of a partially completed semiconductor wafer 100 at various stages of fabrication in accordance with some embodiments of the invention. FIG. 1A shows a substrate layer 102 available for fabrication.

Figure 1B:
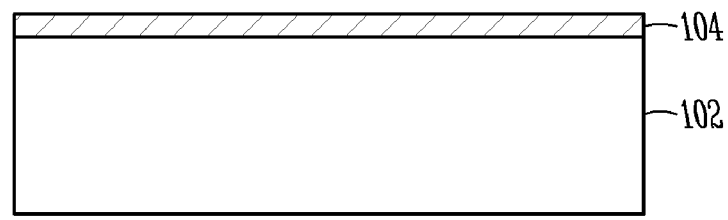

FIG. 1B illustrates a screening oxide layer 104 deposited on substrate 102 shown in FIG. 1A. In some embodiments, screening oxide layer 104 includes silicon dioxide grown on top of substrate 102.

Figure 1C:
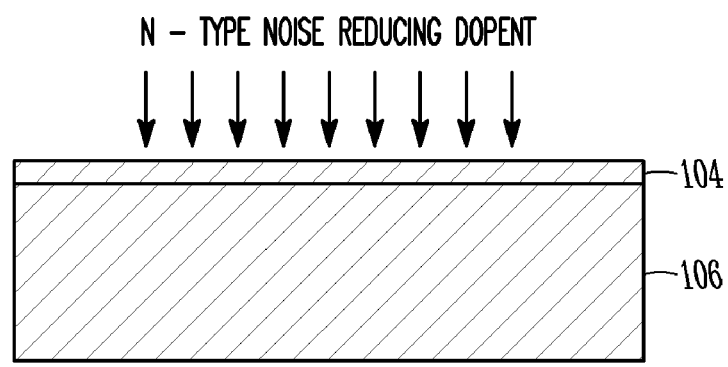

FIG. 1C illustrates a first doping of the substrate 102 shown in FIG. 1B using a first noise reducing dopant. In some embodiments, the first noise reducing dopant used includes an n-type dopant. In some embodiments, the first noise reducing dopant used includes a p-type dopant. Consequently, after the first doping of substrate 102, substrate 102 is transformed into an n-type or a p-type doped substrate 106 depending on the conductivity of the first noise reducing dopant.

Figure 1D:
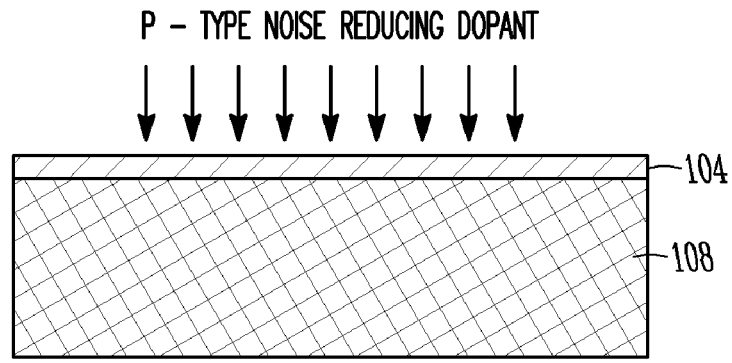

FIG. 1D illustrates a second doping of the n-type or a p-type doped substrate 106 shown in FIG. 1C using a second noise reducing dopant. In some embodiments, the second noise reducing dopant used will include a material having an opposite conductivity type (such as n-type if the first doping used p-type and vice versa) to that of the first noise reducing dopant. In some embodiments, the second noise reducing dopant includes a p-type dopant if the first noise reducing dopant is an n-type dopant. In some embodiments, the second noise reducing dopant includes an n-type dopant if the first noise reducing dopant is a p-type dopant. In some embodiments, the second dopant does not include any noise reducing species. Consequently, after the second doping, n-type or a p-type doped substrate 106 is transformed into a counter-doped substrate 108.

In some embodiments, the depth of the peak concentration to which the non noise reducing part of the first dopant is implanted is different compared to the depth of the peak concentration to which the non noise reducing part of the second dopant is implanted. This allows for formation of buried channel devices. Such buried channel devices formed as mentioned have lower noise contribution compared to a surface channel device. This is primarily due to the larger distance of channel carriers from the gate insulator substrate interface.

In some embodiments, the depth of the peak concentration to which the non noise reducing part of the first dopant is implanted is the same as the depth of the peak concentration of the non noise reducing part of the second dopant. By this the electrical conductivity of the semiconductor is not changed while a certain dose of noise reducing dopants is introduced.

In some embodiments, the dopants used may be one or more of materials such as $AsF_3$, $AsF_5$, $PF_3$, $PF_5$, $SbF_3$, $SbF_5$, $BF_3$ or $BCl_3$ and their associated ions generated in a plasma. In some embodiments, a positively single charged $BF_2^+$ ion is used as a dopant followed by an n-type dopant that contains noise reducing species such as one of the associated ions generated from $PF_5$ or $PF_3$ gas in a plasma discharge. The ions that can be used for implantation are not limited to positive charged ions but can also be negatively charged.

In some embodiments, the n-type and p-type dopants can be implanted together during one implantation step. In some embodiments, the n-type dopant is implanted before the p-type dopant. In some embodiments, the n-type dopant is implanted after the p-type dopant.

In some embodiments, several different types of ions generated in a plasma from the precursor gas (e.g. $AsF_3$, $AsF_5$, $PF_3$, $PF_5$, $SbF_3$, $SbF_5$, $BF_3$ or $BCl_3$) are implanted together during one implant step into the partially completed semiconductor device. In some embodiments, only one species of the ions generated in the plasma from the precursor gas is implanted into the partially completed semiconductor device. In some embodiments, a sub group of the ions generated in a plasma from the precursor gas is implanted into the partially completed semiconductor device.

In some embodiments, the n-type and p-type dopants would stay mainly in the substrate and diffuse within the substrate during an annealing process or a gate insulator material growth process. Additionally, the n- and p-type dopants could also segregate into the gate insulator material upon annealing or upon gate insulator material growth process. However, the noise reducing dopant will mainly be absorbed at the interface between the gate insulator and the substrate as well as in the gate insulator.

Figure 1E:
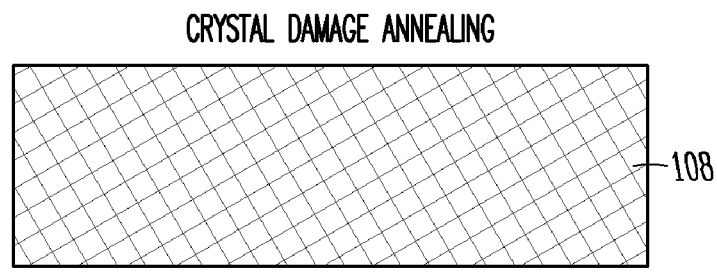

FIG. 1E illustrates a counter-doped substrate 108 after the removal of the screening oxide layer 104 shown in FIG. 1D. In some embodiments, a crystal damage anneal is performed on the substrate during this stage of the fabrication. The anneal time and temperature depend on the desired characteristics of the semiconductor device being fabricated. In some embodiments, crystal damage annealing can be one of a rapid thermal anneal (RTA) or a laser anneal. In some embodiments, the anneal process has temperatures ranging from around 950° C. to about 1200° C. for a duration of about 10 milli-seconds to 60 seconds. In some embodiments, the duration may be for about 10 milli-seconds to about 1 second. In some embodiments, the duration may be for about 1 second to about 60 seconds.

Figure 1F:
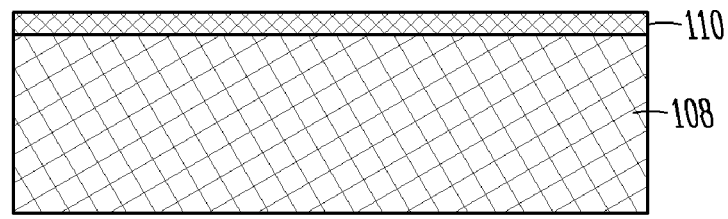

FIG. 1F illustrates the partially completed semiconductor wafer 100 shown in FIG. 1E having a gate insulator layer 110 formed after the thermal annealing. Following the formation of the gate insulator layer 110, a gate stack (not shown) is formed above the gate insulator layer 110.

Figure 2A:
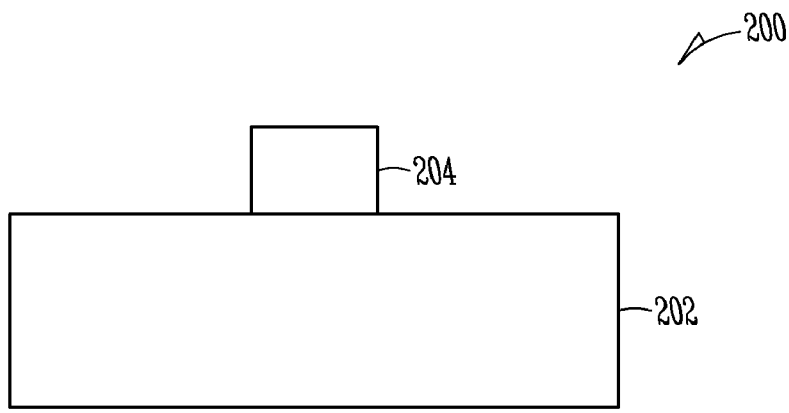
FIG. 2A-2F illustrates cross-sectional views of a partially completed semiconductor wafer having a fin structure at various stages of fabrication in accordance with some embodiments of the invention.

FIG. 2A-2F illustrate cross-sectional views of a partially completed semiconductor wafer 200 having a fin structure at various stages of fabrication, according to some embodiments of the invention. FIG. 2A illustrates a cross-sectional view through a partially completed semiconductor wafer 200 having a silicon fin 204.

Figure 2B:
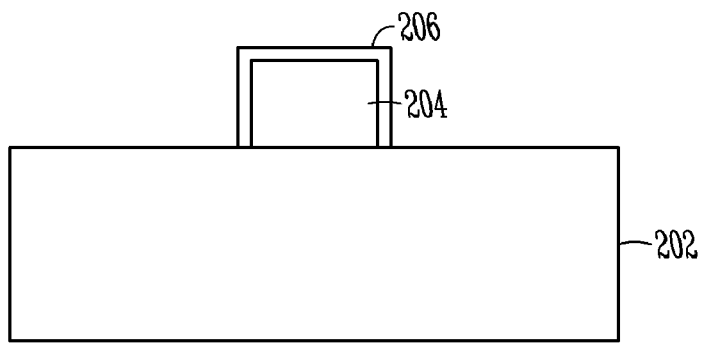

FIG. 2B illustrates a cross-sectional view of semiconductor wafer 200 in FIG. 2A including a screen oxide layer 206 deposited on the substrate 202.

Figure 2C:
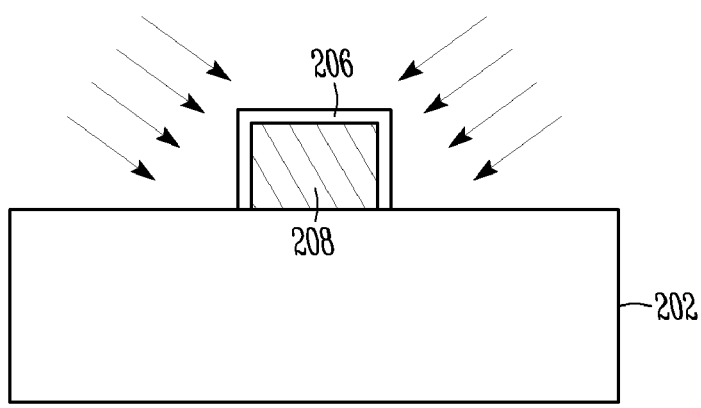

FIG. 2C illustrates a first doping of the silicon fin 204 shown in FIG. 2B using a first noise reducing dopant. In some embodiments, the first noise reducing dopant used can be an n-type dopant. In some embodiments, the first noise reducing dopant used can be a p-type dopant. Consequently, after the first doping of silicon fin 204, silicon fin 204 is transformed into an n-type or a p-type doped silicon fin 208 depending on the conductivity of the first noise reducing dopant. In some embodiments, the depth of the peak concentration to which the non noise reducing part of the first dopant is implanted is different compared to the depth of the peak concentration to which the non noise reducing part of the second dopant is implanted. This allows for formation of buried channel devices. Such buried channel devices formed as mentioned have lower noise contribution compared to a surface channel device. This is primarily due to the larger distance of channel carriers from the gate insulator substrate interface.

In some embodiments, the depth of the peak concentration to which the non noise reducing part of the first dopant is implanted is the same as the depth of the peak concentration of the non noise reducing part of the second dopant. By this the electrical conductivity of the semiconductor is not changed while a certain dose of noise reducing dopants is introduced.

In some embodiments, the dopants used may be one or more of materials such as $AsF_3$, $AsF_5$, $PF_3$, $PF_5$, $SbF_3$, $SbF_5$, $BF_3$ or $BCl_3$ and their associated ions generated in a plasma. In some embodiments, a positively single charged $BF_2^+$ ion is used as a dopant followed by an n-type dopant that contains noise reducing dopant such as one of the associated ions generated from $PF_5$ or $PF_3$ gas in a plasma discharge. The ions that can be used for implantation are not limited to positive charged ions but can also be negatively charged.

In some embodiments, the n-type and p-type dopants can be implanted together during one implantation step. In some embodiments, the n-type dopant is implanted before the p-type dopant. In some embodiments, the n-type dopant is implanted after the p-type dopant.

In some embodiments, several different types of ions generated in a plasma from a precursor gas (e.g. $AsF_3$, $AsF_5$, $PF_3$, $PF_5$, $SbF_3$, $SbF_5$, $BF_3$ or $BCl_3$) are implanted together during one implant step into the partially completed semiconductor device. In some embodiments, only one species of the ions generated in the plasma from the precursor gas is implanted into the partially completed semiconductor device. In some embodiments, a sub group of the ions generated in a plasma from the precursor gas is implanted into the partially completed semiconductor device.

In some embodiments, the n-type and p-type dopants would stay mainly in the substrate and diffuse within the substrate during an annealing process or gate insulator growth. Additionally, the n- and p-type dopants could also segregate into the gate insulator upon annealing or gate insulator growth. However, the noise reducing dopant will mainly be absorbed at the interface between the gate insulator and the substrate and in the gate insulator.

Figure 2D:
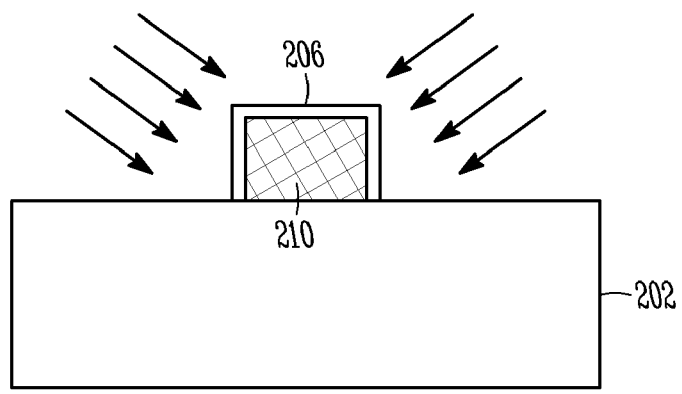

FIG. 2D illustrates a second doping of the n-type or a p-type doped silicon fin 208 shown in FIG. 2C using a second noise reducing dopant. In some embodiments, the second noise reducing dopant used will include a material having an opposite conductivity type (such as n-type if the first doping used p-type and vice versa) to that of the first noise reducing dopant. In some embodiments, the second noise reducing dopant includes a p-type dopant if the first noise reducing dopant is an n-type dopant. In some embodiments, the second noise reducing dopant includes an n-type dopant if the first noise reducing dopant is a p-type dopant. Consequently, after the second doping, the n-type or a p-type doped silicon fin 208 is transformed into counter-doped silicon fin 210.

In some embodiments, the first doping and the second doping is performed using a dual-mode or quad-mode operation. A dual-mode operation includes an implant mode having periods of two separate implantations performed on silicon fin 210 by rotating the silicon fin 210 by 180° about its vertical axis after each implantation period. A quad-mode operation includes an implant mode having periods of four separate implantations performed on silicon fin 210 by rotating the silicon fin 210 by 90° about its vertical axis after each implantation period. The implantation is performed using an ion beam having a material with an n-type dopant, a p-type dopant and a noise reducing dopant. The above-described method of rotating semiconductor wafer 200 in a dual-mode or a quad-mode is used to ensure all channel-forming surfaces of silicon fins 102A-D are evenly implanted with the dopant.

Figure 2E:
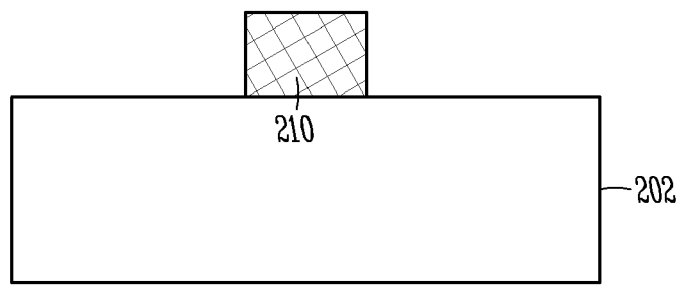

FIG. 2E illustrates a counter-doped silicon fin 210 after the removal of the screening oxide layer 206 shown in FIG. 2D. In some embodiments, a crystal damage anneal is performed on the substrate during this stage of the fabrication.

In some embodiments, following the crystal damage anneal performed above, a hydrogen ($H_2$) or Deuterium ($D_2$) anneal may be performed. In some embodiments, the annealing temperature ranges from about 700° C. to 900° C. for about 1 to 10 minutes. Following the $H_2$ or $D_2$ anneal performed above, a wet HF dip is used followed by a cleaning using ammonia hydrogen peroxide water ($NH_4OH$, $H_2O_2$, and $H_2O$) with lower alkaline content. After the cleaning step a further HF vapor clean can be applied to remove low-quality native oxide that grows quickly on the surface of the substrate. In some embodiments, this HF vapor cleaning is performed in the same chamber were the gate insulator growth is performed.

Figure 2F:
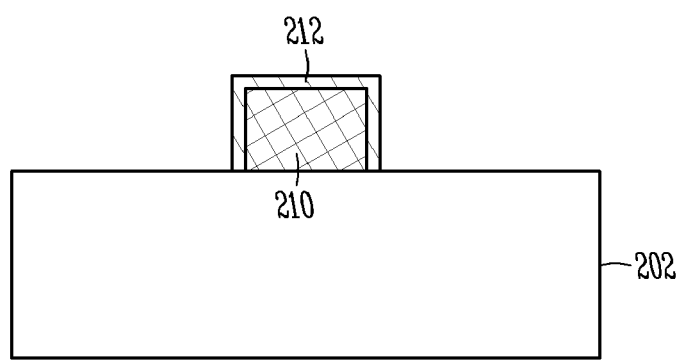

FIG. 2F illustrates the growth of a gate insulator layer 212 after the thermal annealing process performed on partially completed semiconductor wafer 200 shown in FIG. 2E. Following thermal annealing, a gate stack (not shown) is formed above the gate insulator layer 212. In some embodiments, a poly silicon predoping implant is performed after the gate electrode material (or part of it) is deposited. In some embodiments, the gate poly pre-doping is performed using compound dopants containing noise reducing species. In some embodiments, a further implant of a n-type/p-type implant is performed over the fin 210 to form an extension region (not shown) followed by a tilted p-type/n-type implant that forms a halo region (not shown) within fin 210. In some embodiments, the extension region and the halo region formed as mentioned above is formed in fin structures that are shown in FIG. 2F. In some embodiments, compound dopants containing noise reducing species are used for extension and halo implant.

Figure 3A:
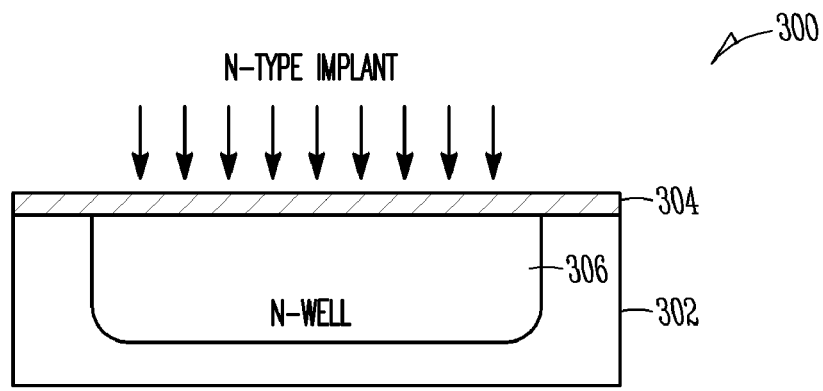
FIG. 3A-3C illustrates cross-sectional views of a partially completed semiconductor wafer having a triple well structure at various stages of fabrication in accordance with some embodiments of the invention.
Figure 3B:
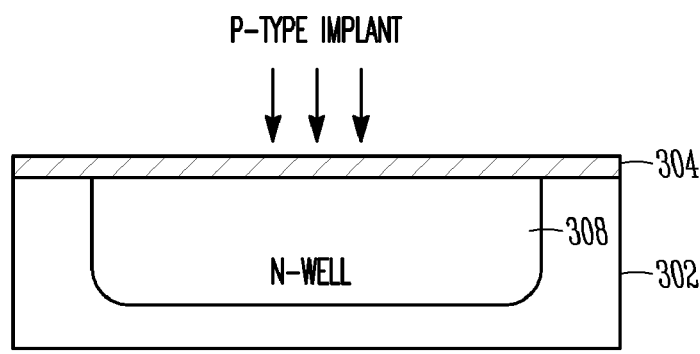
Figure 3C:
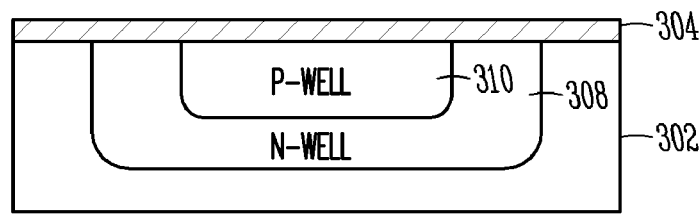

FIG. 3A-3C illustrates cross-sectional views of a partially completed semiconductor substrate having a triple well structure at various stages of fabrication in accordance with some embodiments of the invention. FIG. 3A illustrates a cross-sectional view of a partially completed semiconductor wafer 300 having a screen oxide layer 304 supported by the substrate 302 being implanted with an n-type noise reducing dopant, according to some embodiment of the invention.

FIG. 3B illustrates a cross-sectional view of the partially completed semiconductor wafer 300 shown in FIG. 3A having an n-well 306 formed by the implantation of an n-type noise reducing dopant over a portion of the surface of the screen oxide layer 304, according to some embodiments of the invention. FIG. 3B also shows the implantation of a p-type noise reducing dopant over the surface of the screen oxide layer 304 which corresponds to the n-well 306 region within the partially completed semiconductor wafer 300. Additionally, in some embodiments, an n-band 307 can be formed at the bottom of the n-well by using a high energy implant of an n-type ion such as phosphorous along with a noise reducing dopant ion such as Fluorine. The advantage of a high energy implant is that the crystal damage lies deeper in the substrate.

In some embodiments, n-band 307 may be formed for providing a low resistive path in the n-well to suppress the latch-up effect caused by parasitic bipolar transistors and thyristors formed by all the used wells and also by PMOS with nearby NMOS transistors. In some embodiments, n-band 307 may be formed to provide for the suppression of substrate coupling by providing a low resistive shield in the substrate.

FIG. 3C illustrates a cross-sectional view of the partially completed semiconductor wafer 300 shown in FIG. 3B having a p-well 308 formed within the n-well 306, according to some embodiments of the invention.

Figure 4A:
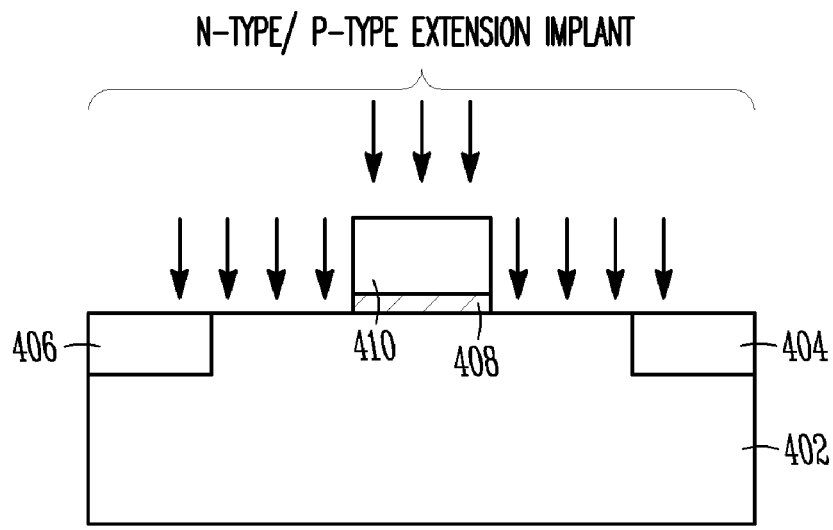
FIG. 4A-4D illustrates cross-sectional views of a partially completed semiconductor wafer having an extension and halo structure at various stages of fabrication in accordance with some embodiments of the invention.

FIG. 4A-4D illustrate cross-sectional views of a partially completed semiconductor substrate having an extension and halo structure at various stages of fabrication in accordance with some embodiments of the invention. FIG. 4A illustrates a cross-sectional view of a partially completed semiconductor wafer 400 having a substrate 402, shallow trench isolation 404 and 406, a gate insulator 408, a gate stack 410. Additionally, FIG. 4A shows an n-type or p-type noise reducing dopant being implanted on the partially completed semiconductor wafer 400.

Figure 4B:
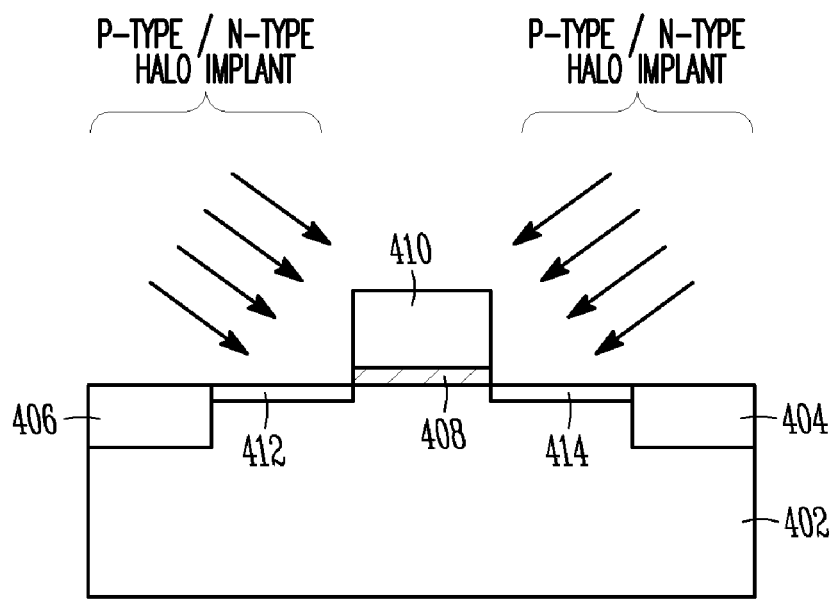

FIG. 4B illustrates a cross-sectional view of the partially completed semiconductor wafer 400 shown in FIG. 4A having extension regions 412 and 414, according to some embodiments of the invention. Extension regions 412 and 414 are formed by the implantation of a p-type or n-type noise reducing dopant into the semiconductor wafer 400.

Figure 4C:
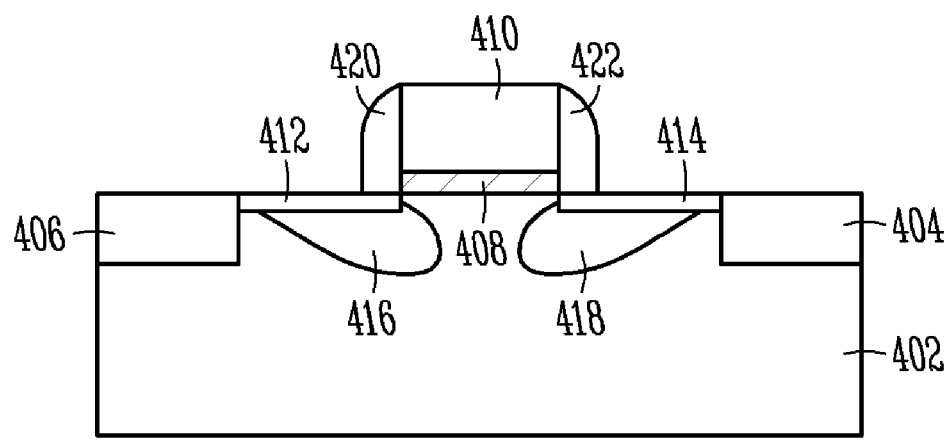

FIG. 4C illustrates a partially completed semiconductor wafer 400 shown in FIG. 4B having halo regions 416 and 418 formed within substrate 402 using a tilted implantation. In some embodiments, a halo implant is an implant at a tilt angle used to create a non-uniform channel doping profile in a MOSFET. Halo implant allows for better control of the short-channel effect. Also shown in FIG. 4C are spacers 420 and 422 which are formed on either side of the gate stack 410. In some embodiments, a p-type or n-type dopant including noise reducing dopants are used for the halo implant.

In some embodiments, the dopants used for extension and halo implant may be one or more of the precursor materials such as $AsF_3$, $AsF_5$, $PF_3$, $PF_5$, $SbF_3$, $SbF_5$, $BF_3$ or $BCl_3$ and their associated ions generated in a plasma. In some embodiments, $BF_2^+$ ion is used as a dopant followed by an n-type dopant that contains noise reducing dopant such as one of the associated ions generated from $PF_5$ or $PF_3$ precursor gas in a plasma discharge. The ions that can be used for implantation are not limited to positive charged ions but can also be negatively charged.

Figure 4D:
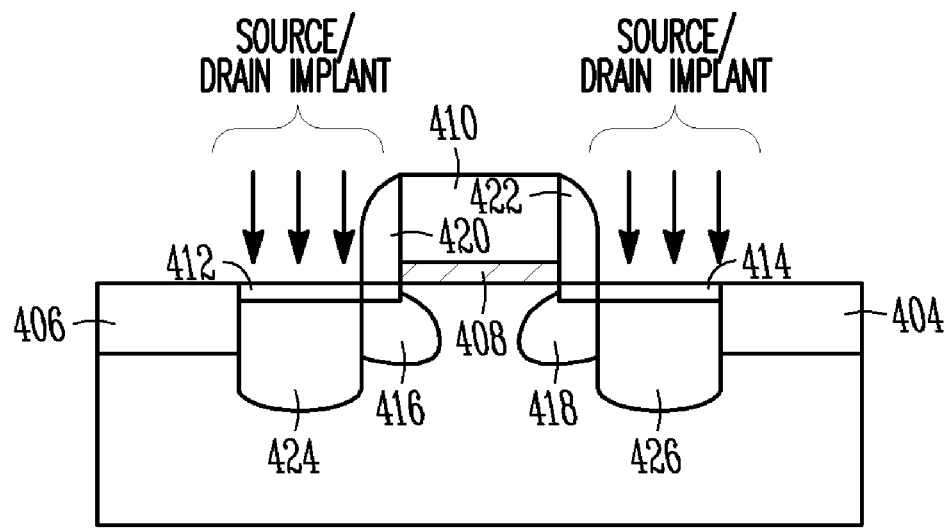

FIG. 4D illustrates a cross-sectional view of the partially completed semiconductor wafer 400 showing drain and source regions 424 and 426, respectively formed by the implantation of source/drain implants. In some embodiments, a p-type or n-type dopant including noise reducing dopants are used for the source/drain implant. In some embodiments, the dopants may be one or more of materials such as $AsF_3$, $AsF_5$, $PF_3$, $PF_5$, $SbF_3$, $SbF_5$, $BF_3$ or $BCl_3$ and their associated ions generated in a plasma. In some embodiments, one of the previous mentioned dopants can be used as a first dopant to perform a pre-amorphousization, allowing the formation of shallow junctions, followed by a second dopant to form the source and drain junctions.

In some embodiments, implanting of the first dopant and/or second dopant as described above may be performed during at least one period selected from the group consisting of (a) after forming a substrate but before forming a gate insulator material, (b) after forming an silicon oxide layer that is part of the gate insulator but before forming further parts of the gate insulator material stack, (c) after having formed the full gate insulator material stack but before forming a gate electrode material, (d) after forming a portion of the gate electrode material stack but before completing the gate electrode material stack, (e) after forming a gate electrode material stack but before forming the gate structure, (f) after forming the gate structure but before forming the gate sidewall spacers, and (g) after forming the gate sidewall spacers.

The first dopant may be implanted at any time in the manufacturing process. The second dopant may also be implanted at any time in the manufacturing process. The first dopant may be implanted at the same time as the second dopant. The first dopant may be implanted before the second dopant. The first dopant may be implant after the second dopant.

Figure 5:
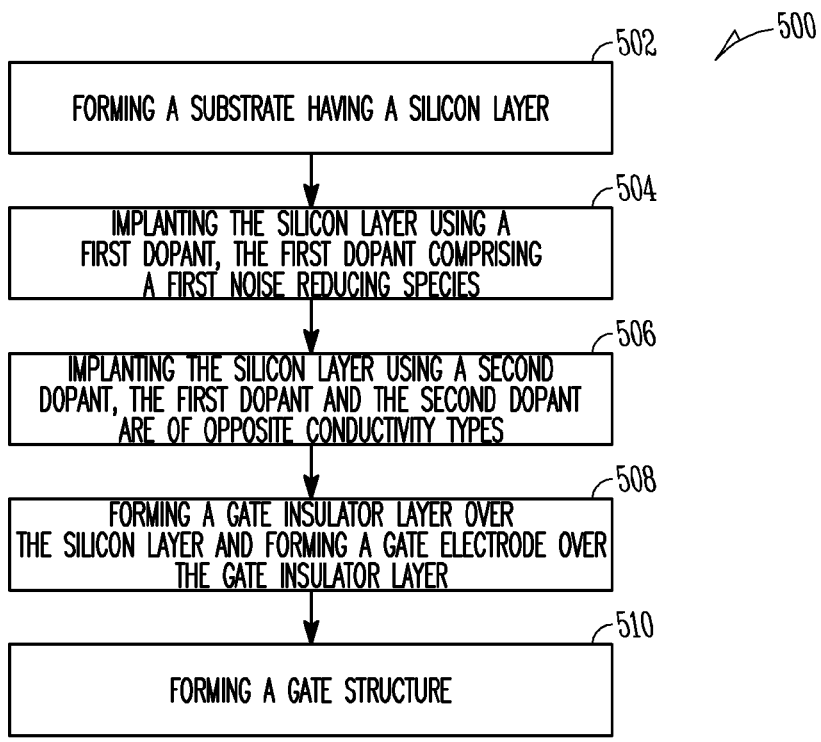
FIG. 5 illustrates a flow chart showing a method of fabrication of a semiconductor wafer using counter-doping of noise reducing dopants, according to some embodiments of the invention.

FIG. 5 illustrates a flow chart showing a method 500 for fabrication of a semiconductor wafer having a silicon layer by counter-doping the semi-conductor wafer using n-type and/or p-type noise reducing dopants, according to some embodiments of the invention.

At 502, method 500 includes forming a substrate having a silicon layer. In some embodiments, the silicon layer is a single crystal silicon layer. In some embodiments, forming a substrate includes growing a screening oxide layer 104 over the silicon surface prior to a dopant implant process performed according to that shown in FIG. 1B. In some embodiments, the screening oxide layer 104 provides protection against unintended knock-on metallic contaminants (such as iron (Fe) and Nickel (Ni)) received from the ion implanter. In some embodiments, the thickness of the screening oxide layer 104 can range from about 1 nm to about 15 nm.

At 504, method 500 includes implanting the silicon layer using a first dopant material having a first conductivity type and including a first noise reducing species that can include one of fluorine, chlorine, deuterium and hydrogen. In some embodiments the first dopant is an n-type material and in other embodiments, it is a p-type material. In some embodiments, the first dopant includes one or more of materials such as $AsF_3$, $AsF_5$, $PF_3$, $PF_5$, $SbF_3$, $SbF_5$, $BF_3$, $BCl_3$ and their associated ions generated in a plasma. In some embodiments, the first dopant lacks the single positively charged ion $BF_2^+$.

In some embodiments, the first dopant lacks a $BF_2$ ion. In some embodiments, the first dopant lacks the ion $BF^+$. In some embodiments, the first dopant lacks a BF ion. In some embodiments, the first dopant lacks a single positively charged $BF_3^+$ ion. In some embodiments, the first dopant lacks a single negatively charged $BF_3^-$ ion. In some embodiments, the first dopant lacks a $BF_3$ ion. In some embodiments, the first dopant lacks the ion $BCl^+$. In some embodiments, the first dopant lacks a BCl ion. In some embodiments, the first dopants lacks the ion $BCl_2^+$. In some embodiments, the first dopant lacks a $BCl_2$ ion. In some embodiments, the first dopant lacks the element Boron.

At 506, method 500 includes implanting the silicon layer using a second dopant material having a second conductivity type (e.g., p-type, n-type). The second conductivity type has an opposite polarity to the first conductivity type. For example, if the first implantation is performed using an n-type material, the second implantation is performed using a p-type material and vice-versa. In some embodiments, the second dopant lacks a noise reducing species. In some embodiments, the second dopant material includes a second noise reducing species that can include fluorine, chlorine, deuterium and hydrogen. In some embodiments, the second dopant lacks the single positively charged ion $BF_2^+$. In some embodiments, the second dopant lacks a $BF_2$ ion. In some embodiments, the second dopant lacks the ion $BF^+$. In some embodiments, the second dopant lacks a BF ion. In some embodiments, the second dopant lacks a single positively charged $BF_3^+$ ion. In some embodiments, the second dopant lacks a single negatively charged $BF_3^-$ ion. In some embodiments, the second dopant lacks a $BF_3$ ion. In some embodiments, the second dopant lacks the ion $BCl^+$. In some embodiments, the second dopant lacks a BCl ion. In some embodiments, the second dopants lacks the ion $BCl_2^+$. In some embodiments, the second dopant lacks a $BCl_2$ ion. In some embodiments, the second dopant includes one or more of materials such as $AsF_3$, $AsF_5$, $PF_3$, $PF_5$, $SbF_3$, $SbF_5$, $BF_3$, $BCl_3$ and their associated ions generated in a plasma. The ions that can be used for implantation are not limited to positive charged ions but can also be negatively charged.

In some embodiments, the n-type and p-type dopants can be implanted together during one implantation step. In some embodiments, the n-type dopant is implanted before the p-type dopant. In some embodiments, the n-type dopant is implanted after the p-type dopant.

In some embodiments, all kind of ions generated in a plasma from the precursor gas are implanted together during one implant step into the partially completed semiconductor device. In some embodiments, only one species of the ions generated in the plasma from the precursor gas is implanted into the partially completed semiconductor device. In some embodiments, a sub group of the ions generated in a plasma from the precursor gas is implanted into the partially completed semiconductor device.

In some embodiments, at 504 and/or 506, one of the two implantations, namely the first implantation or the second implantation, may be performed using a material that does not include a noise reducing dopant while the other implantation includes a noise reducing dopant.

At 504 and/or 506, in some embodiments, method 500 further includes implanting the first dopant to a first depth that is different from a second depth to which the second dopant is implanted. This allows for formation of buried channel devices. Such buried channel devices formed as mentioned has lower noise contribution compared to a surface channel device. In some embodiments, the depth of the peak concentration to which the non noise reducing part of the first dopant is implanted is the same as the depth of the peak concentration of the non noise reducing part of the second dopant. By this the electrical conductivity of the semiconductor is not changed while a certain dose of noise reducing dopants is introduced.

In some embodiments, where $BF_2^+$ is counter doped with an n-type dopant free of a noise reducing species, the $BF_2$ dosage can be chosen to be higher than 1E13 atoms/cm² in the case of a threshold voltage adjust implant or a buried channel stop implant. In some embodiments, the dose of $BF_2$ threshold voltage adjust or buried channel stop implant can be chosen to be higher than any one of 1E13, 1.1E13, 1.2E13, 1.3E13, 1.4E13, 1.5E13, 1.6E13, 1.7E13, 1.8E13, 1.9E13, 2E13, 3E13, 4E13, 5E13, 5.1E13, 5.2E13, 5.3E13, 5.4E13, 5.5E13, 5.6E13, 5.7E13, 5.8E13, 5.9E13, 6E13, 7E13, 8E13, 9E13, 1E14, 1.1E14, 1.2E14, 1.3E14, 1.4E14, 1.5E14, 1.6E14, 1.7E14, 1.8E14, 1.9E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16, and 2E16 atoms/cm². In the above embodiments, the n-type counter dopant dose is chosen to be higher than any one of 1E12, 2E12, 3E12, 4E12, 5E12, 6E12, 7E12, 8E12, 9E12, 1E13, 1.1E13, 1.2E13, 1.3E13, 1.4E13, 1.5E13, 1.6E13, 1.7E13, 1.8E13, 1.9E13, 2E13, 3E13, 4E13, 5E13, 5.1E13, 5.2E13, 5.3E13, 5.4E13, 5.5E13, 5.6E13, 5.7E13, 5.8E13, 5.9E13, 6E13, 7E13, 8E13, 9E13, 1E14, 1.1E14, 1.2E14, 1.3E14, 1.4E14, 1.5E14, 1.6E14, 1.7E14, 1.8E14, 1.9E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16 and 2E16 1/cm² if the n-type doping is performed before the formation of the gate insulator or performing the gate insulator growth.

In some embodiments, where $BF_2^+$ is counter doped with an n-type dopant free of a noise reducing species, the $BF_2$ dosage can be chosen to be higher than 2E13 atoms/cm² in the case of a well implant. In some embodiments, the dose of the $BF_2$ well implant can be chosen to be higher than any one of 2E13, 2.1E13, 2.2E13, 2.3E13, 2.4E13, 2.5E13, 2.6E13, 2.7E13, 2.8E13, 2.9E13, 3E13, 4E13, 5E13, 5.1E13, 5.2E13, 5.3E13, 5.4E13, 5.5E13, 5.6E13, 5.7E13, 5.8E13, 5.9E13, 6E13, 7E13, 8E13, 9E13, 1E14, 1.1E14, 1.2E14, 1.3E14, 1.4E14, 1.5E14, 1.6E14, 1.7E14, 1.8E14, 1.9E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16 and 2E16 atoms/cm². In the above embodiments, the n-type counter dopant dose is chosen to be higher than any one of 1E12, 2E12, 3E12, 4E12, 5E12, 6E12, 7E12, 8E12, 9E12, 1E13, 1.1E13, 1.2E13, 1.3E13, 1.4E13, 1.5E13, 1.6E13, 1.7E13, 1.8E13, 1.9E13, 2E13, 3E13, 4E13, 5E13, 5.1E13, 5.2E13, 5.3E13, 5.4E13, 5.5E13, 5.6E13, 5.7E13, 5.8E13, 5.9E13, 6E13, 7E13, 8E13, 9E13, 1E14, 1.1E14, 1.2E14, 1.3E14, 1.4E14, 1.5E14, 1.6E14, 1.7E14, 1.8E14, 1.9E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16 and 2E16 1/cm² if the n-type doping is performed before the formation of the gate insulator or performing the gate insulator growth.

In some embodiments, where $BF_2^+$ is counter doped with an n-type dopant free of a noise reducing species, the $BF_2$ dosage can be chosen to be higher than 1E15 atoms/cm² in the case of a gate poly silicon predoping implant. In some embodiments, the dose of the $BF_2$ gate poly silicon predoping implant can be chosen to be higher than any one of 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.4E15, 4.5E15, 4.6E15, 4.7E15, 4.8E15, 4.9E15, 5E15, 6E15, 7E15, 8E15, 9E15, 1E16 and 2E16 atoms/cm² and an n-type counter dopant with a dose to be higher than 1E13 1/cm² if the n-type doping is performed after the growth of the gate insulator.

In some embodiments, where $BF_2^+$ is counter doped with an n-type dopant free of a noise reducing species, the $BF_2$ dosage can be chosen to be higher than 5E13 atoms/cm² in the case of an extension implant. In some embodiments, the dose of the $BF_2$ extension implant can be chosen to be higher than any one of 5E13, 1E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16 and 2E16 atoms/cm² and an n-type counter dopant with a dose to be higher than 1E12 1/cm².

In some embodiments, where $BF_2^+$ is counter doped with an n-type dopant free of a noise reducing species, the $BF_2$ dosage can be chosen to be higher than 1E13 atoms/cm² in the case of a halo implant. In some embodiments, the dose of the $BF_2$ halo implant can be chosen to be higher than any one of 1E13, 1.1E13, 1.2E13, 1.3E13, 1.4E13, 1.5E13, 1.6E13, 1.7E13, 1.8E13, 1.9E13, 2E13, 3E13, 4E13, 5E13, 6E13, 7E13, 8E13, 9E13, 1E14, 1.1E14, 1.2E14, 1.3E14, 1.5E14, 1.6E14, 1.7E14, 1.8E14, 1.9E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16 and 2E16 atoms/cm² and an n-type counter dopant with a dose to be higher than 1E12 1/cm².

In some embodiments, where $BF_2^+$ is counter doped with an n-type dopant free of a noise reducing species, the $BF_2$ dosage can be chosen to be higher than 1E15 atoms/cm² in the case of a drain/source implant. In some embodiments, the dose of the $BF_2$ drain/source implant can be chosen to be higher than any one of 1E15, 2E15, 2.1E15, 2.2E15, 2.3E15, 2.4E15, 2.5E15, 2.6E15, 2.7E15, 2.8E15, 2.9E15, 3E15, 4E15, 4.1E15, 4.2E15, 4.3E15, 4.4E15, 4.5E15, 4.6E15, 4.7E15, 4.8E15, 4.9E15, 5E15, 5.1E15, 5.2E15, 5.3E15, 5.4E15, 5.5E15, 5.6E15, 5.7E15, 5.8E15, 5.9E15, 6E15, 7E15, 8E15, 9E15, 1E16, and 2E16 atoms/cm$^2$ and an n-type counter dopant with a dose to be higher than 1E12 1/cm$^2$. In some embodiments, BF$_2$ is combined with another n-type noise reducing dopant such as PF$_3$, PF$_5$, AsF$_3$, AsF$_5$, SbF$_3$, and SbF$_5$ and their associated ions generated in a plasma.

At 508, the method includes forming a gate insulator disposed on the silicon layer. In some embodiments, the gate insulator is formed before implanting the silicon layer using a first noise reducing dopant and/or a second noise reducing dopant.

In some embodiments, implanting of the first dopant and/or second dopant as described above may be performed during at least one period selected from the group consisting of (a) after forming a substrate but before forming a gate insulator material, (b) after forming an silicon oxide layer that is part of the gate insulator but before forming further parts of the gate insulator material stack, (c) after having formed the full gate insulator material stack but before forming a gate electrode material, (d) after forming a portion of the gate electrode material stack but before completing the gate electrode material stack, (e) after forming a gate electrode material stack but before forming the gate structure, (f) after forming the gate structure but before forming the gate sidewall spacers, and (g) after forming the gate sidewall spacers.

In some embodiments, the first dopant and second-type dopant are implanted into the same partially completed structure. In some embodiments, the partially completed structure where the first dopant is implanted is different from the partially completed structure where the second dopant is implanted. So in general implanting the first dopant and second dopant can be distributed over or spread between different partially completed structures of the semiconductor device summing up the appropriate dosage for noise reduction in the fully completed device.

In some embodiments, counter doping may be practiced by implanting an ion from PF$_5$ into to the poly silicon gate material of NMOS and PMOS devices after poly silicon gate material deposition and later counter-doping the PMOS gate with a BF$_2$ ion. In some embodiments counter doping may be performed after etching the gate electrode material and a first dopant may be implanted before forming the spacers and could be applied to the gate stack and halo regions (See FIG. 4A-4C) and the second dopant will be implanted into the gate stack and into the drain and source regions (FIG. 4D) after forming the spacers. In some embodiments, the D/S regions of a PMOS may be pre-amorphousized with an ion of AsF$_5$ or SbF$_5$ and later counter doped with BF$_2$.

At 510, the method includes forming a gate stack disposed on the gate insulator.

Figure 6:
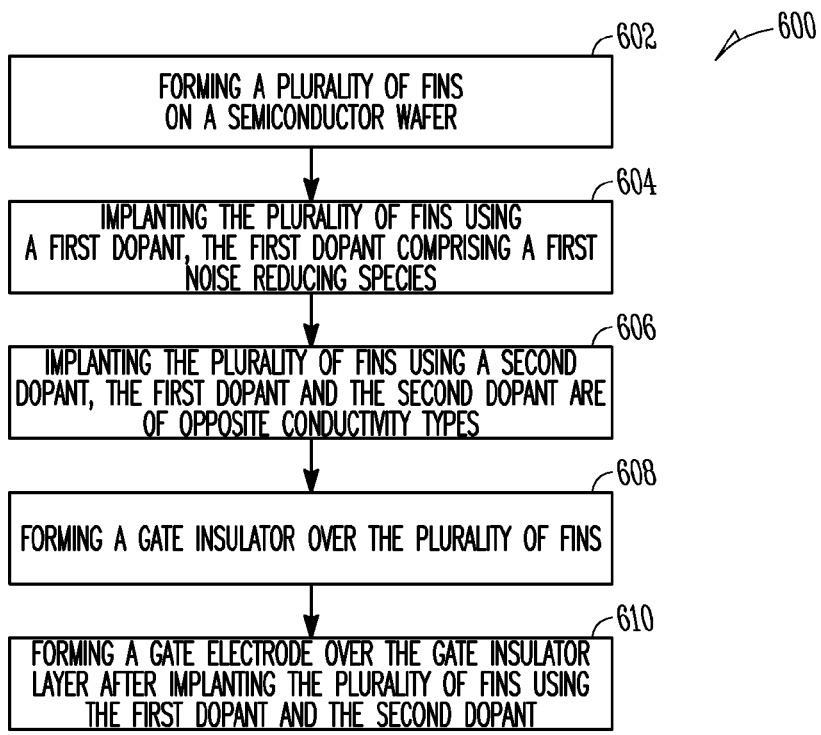
FIG. 6 illustrates a flow chart showing a method of fabrication of a semiconductor wafer having a plurality of fins, using counter-doping of noise reducing dopants, according to some embodiments of the invention.

FIG. 6 illustrates a flow chart showing a method 600 of fabrication of a semiconductor wafer having a plurality of fins by counter-doping the semi-conductor wafer using n-type and/or p-type noise reducing dopants, according to some embodiments of the invention.

At 602, method 600 includes forming a plurality of fins supported by a semiconductor wafer. In some embodiments, the length, height and width of each of the fins are determined by the characteristics of the device that is being fabricated. At 604, in some embodiments, the method 600 includes forming a screening oxide layer on the plurality of fins.

At 606, method 600 includes implanting into the plurality of fins a first dopant having a first conductivity type and including a first noise reducing species such as fluorine, chlorine, deuterium and hydrogen. In some embodiments the first dopant is an n-type material and in other embodiments, it is a p-type material. In some embodiments, the first dopant includes one or more of materials such as AsF$_3$, AsF$_5$, PF$_3$, PF$_5$, SbF$_3$, SbF$_5$, BF$_3$, BCl$_3$ and their associated ions generated in a plasma. In some embodiments, the first dopant lacks the single positively charged ion BF$_2^+$. In some embodiments, the first dopant lacks a BF$_2$ ion. In some embodiments, the first dopant lacks the ion BF$^+$. In some embodiments, the first dopant lacks a BF ion. In some embodiments, the first dopant lacks a single positively charged BF$_3^+$ ion. In some embodiments, the first dopant lacks a single negatively charged BF$_3^-$ ion. In some embodiments, the first dopant lacks a BF$_3$ ion. In some embodiments, the first dopant lacks the ion BCl$^+$. In some embodiments, the first dopant lacks a BCl ion. In some embodiments, the first dopants lacks the ion BCl$_2^+$. In some embodiments, the first dopant lacks a BCl$_2$ ion. In some embodiments, the first dopant lacks the element Boron.

At 608, method 600 includes implanting into the plurality of fins a second dopant having a second conductivity type. The second conductivity type has an opposite polarity to the first conductivity type. For example, if the first implantation is performed using an n-type material, the second implantation is performed using a p-type material and vice-versa. In some embodiments, the second dopant lacks a noise reducing species. In some embodiments, the second dopant material includes a second noise reducing species that can include fluorine, chlorine, deuterium and hydrogen. In some embodiments, the second dopant lacks the single positively charged ion BF$_2^+$. In some embodiments, the second dopant lacks a BF$_2$ ion. In some embodiments, the second dopant lacks the ion BF$^+$. In some embodiments, the second dopant lacks a BF ion. In some embodiments, the second dopant lacks a single positively charged BF$_3^+$ ion. In some embodiments, the second dopant lacks a single negatively charged BF$_3^-$ ion. In some embodiments, the second dopant lacks a BF$_3$ ion. In some embodiments, the second dopant lacks the ion BCl$^+$. In some embodiments, the second dopant lacks a BCl ion. In some embodiments, the second dopants lacks the ion BCl$_2^+$. In some embodiments, the second dopant lacks a BCl$_2$ ion. In some embodiments, the second dopant includes one or more of materials such as AsF$_3$, AsF$_5$, PF$_3$, PF$_5$, SbF$_3$, SbF$_5$, BF$_3$, BCl$_3$ and their associated ions generated in a plasma. The ions that can be used for implantation are not limited to positive charged ions but can also be negatively charged.

In some embodiments, the n-type and p-type dopants can be implanted together during one implantation step. In some embodiments, the n-type dopant is implanted before the p-type dopant. In some embodiments, the n-type dopant is implanted after the p-type dopant.

In some embodiments, all kind of ions generated in a plasma from the precursor gas are implanted together during one implant step into the partially completed semiconductor device. In some embodiments, only one species of the ions generated in the plasma from the precursor gas is implanted into the partially completed semiconductor device. In some embodiments, a sub group of the ions generated in a plasma from the precursor gas is implanted into the partially completed semiconductor device.

In some embodiments, at 606 or 608, one of the two implantations namely the first implantation or the second implantation is performed using a material that does not include a noise reducing dopant while the other implantation includes a noise reducing dopant.

At 606 and 608, in some embodiments, method 600 further includes implanting the first dopant to a first depth that is different from a second depth to which the second dopant is implanted. This allows for formation of buried channel devices. Such buried channel devices formed as mentioned has lower noise contribution compared to a surface channel device. In some embodiments, the depth of the peak concentration to which the non noise reducing part of the first dopant is implanted is the same as the depth of the peak concentration of the non noise reducing part of the second dopant. By this the electrical conductivity of the semiconductor is not changed while a certain dose of noise reducing dopants is introduced. At 610, in some embodiments, method 600 includes removing the screening oxide layer from the plurality of fins.

In some embodiments, where $BF_2^+$ is counter doped with an n-type dopant free of a noise reducing species, the $BF_2$ dosage can be chosen to be higher than 1E13 atoms/cm$^2$ in the case of a threshold voltage adjust implant or a buried channel stop implant. In some embodiments, the dose of $BF_2$ threshold voltage adjust or buried channel stop implant can be chosen to be higher than any one of 1E13, 1.1E13, 1.2E13, 1.3E13, 1.4E13, 1.5E13, 1.6E13, 1.7E13, 1.8E13, 1.9E13, 2E13, 3E13, 4E13, 5E13, 5.1E13, 5.2E13, 5.3E13, 5.4E13, 5.5E13, 5.6E13, 5.7E13, 5.8E13, 5.9E13, 6E13, 7E13, 8E13, 9E13, 1E14, 1.1E14, 1.2E14, 1.3E14, 1.4E14, 1.5E14, 1.6E14, 1.7E14, 1.8E14, 1.9E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16, and 2E16 atoms/cm$^2$. In the above embodiments, the n-type counter dopant dose is chosen to be higher than any one of 1E12, 2E12, 3E12, 4E12, 5E12, 6E12, 7E12, 8E12, 9E12, 1E13, 1.1E13, 1.2E13, 1.3E13, 1.4E13, 1.5E13, 1.6E13, 1.7E13, 1.8E13, 1.9E13, 2E13, 3E13, 4E13, 5E13, 5.1E13, 5.2E13, 5.3E13, 5.4E13, 5.5E13, 5.6E13, 5.7E13, 5.8E13, 5.9E13, 6E13, 7E13, 8E13, 9E13, 1E14, 1.1E14, 1.2E14, 1.3E14, 1.4E14, 1.5E14, 1.6E14, 1.7E14, 1.8E14, 1.9E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16 and 2E16 1/cm$^2$ if the n-type doping is performed before the formation of the gate insulator or performing the gate insulator growth.

In some embodiments, where $BF_2^+$ is counter doped with an n-type dopant free of a noise reducing species, the $BF_2$ dosage can be chosen to be higher than 2E13 atoms/cm$^2$ in the case of a well implant. In some embodiments, the dose of the $BF_2$ well implant can be chosen to be higher than any one of 2E13, 2.1E13, 2.2E13, 2.3E13, 2.4E13, 2.5E13, 2.6E13, 2.7E13, 2.8E13, 2.9E13, 3E13, 4E13, 5E13, 5.1E13, 5.2E13, 5.3E13, 5.4E13, 5.5E13, 5.6E13, 5.7E13, 5.8E13, 5.9E13, 6E13, 7E13, 8E13, 9E13, 1E14, 1.1E14, 1.2E14, 1.3E14, 1.4E14, 1.5E14, 1.6E14, 1.7E14, 1.8E14, 1.9E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16 and 2E16 atoms/cm$^2$. In the above embodiments, the n-type counter dopant dose is chosen to be higher than any one of 1E12, 2E12, 3E12, 4E12, 5E12, 6E12, 7E12, 8E12, 9E12, 1E13, 1.1E13, 1.2E13, 1.3E13, 1.4E13, 1.5E13, 1.6E13, 1.7E13, 1.8E13, 1.9E13, 2E13, 3E13, 4E13, 5E13, 5.1E13, 5.2E13, 5.3E13, 5.4E13, 5.5E13, 5.6E13, 5.7E13, 5.8E13, 5.9E13, 6E13, 7E13, 8E13, 9E13, 1E14, 1.1E14, 1.2E14, 1.3E14, 1.4E14, 1.5E14, 1.6E14, 1.7E14, 1.8E14, 1.9E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16 and 2E16 1/cm$^2$ if the n-type doping is performed before the formation of the gate insulator or performing the gate insulator growth.

In some embodiments, where $BF_2^+$ is counter doped with an n-type dopant free of a noise reducing species, the $BF_2$ dosage can be chosen to be higher than 1E15 atoms/cm$^2$ in the case of a gate poly silicon predoping implant. In some embodiments, the dose of the $BF_2$ gate poly silicon predoping implant can be chosen to be higher than any one of 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.4E15, 4.5E15, 4.6E15, 4.7E15, 4.8E15, 4.9E15, 5E15, 6E15, 7E15, 8E15, 9E15, 1E16 and 2E16 atoms/cm$^2$ and an n-type counter dopant with a dose to be higher than 1E13 1/cm$^2$ if the n-type doping is performed after the growth of the gate insulator.

In some embodiments, where $BF_2^+$ is counter doped with an n-type dopant free of a noise reducing species, the $BF_2$ dosage can be chosen to be higher than 5E13 atoms/cm$^2$ in the case of an extension implant. In some embodiments, the dose of the $BF_2$ extension implant can be chosen to be higher than any one of 5E13, 1E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16 and 2E16 atoms/cm$^2$ and an n-type counter dopant with a dose to be higher than 1E12 1/cm$^2$.

In some embodiments, where $BF_2^+$ is counter doped with an n-type dopant free of a noise reducing species, the $BF_2$ dosage can be chosen to be higher than 1E13 atoms/cm$^2$ in the case of a halo implant. In some embodiments, the dose of the $BF_2$ halo implant can be chosen to be higher than any one of 1E13, 1.1E13, 1.2E13, 1.3E13, 1.4E13, 1.5E13, 1.6E13, 1.7E13, 1.8E13, 1.9E13, 2E13, 3E13, 4E13, 5E13, 6E13, 7E13, 8E13, 9E13, 1E14, 1.1E14, 1.2E14, 1.3E14, 1.5E14, 1.6E14, 1.7E14, 1.8E14, 1.9E14, 2E14, 3E14, 4E14, 4.1E14, 4.2E14, 4.3E14, 4.4E14, 4.5E14, 4.6E14, 4.7E14, 4.8E14, 4.9E14, 5E14, 5.1E14, 5.2E14, 5.3E14, 5.4E14, 5.5E14, 5.6E14, 5.7E14, 5.8E14, 5.9E14, 6E14, 7E14, 8E14, 9E14, 1E15, 2E15, 2.1E15, 2.2E15, 2.3E15, 2.4E15, 2.5E15, 2.6E15, 2.7E15, 2.8E15, 2.9E15, 3E15, 3.1E15, 3.2E15, 3.3E15, 3.4E15, 3.5E15, 3.6E15, 3.7E15, 3.8E15, 3.9E15, 4E15, 4.1E15, 4.2E15, 4.3E15, 4.5E15, 4.6E15, 4.7E15, 4.8E15, 4.9E15, 5E15, 6E15, 7E15, 8E15, 9E15, 1E16 and 2E16 atoms/cm$^2$ and an n-type counter dopant with a dose to be higher than 1E12 1/cm$^2$.

In some embodiments, where $BF_2^+$ is counter doped with an n-type dopant free of a noise reducing species, the $BF_2$ dosage can be chosen to be higher than 1E15 atoms/cm$^2$ in the case of a drain/source implant. In some embodiments, the dose of the $BF_2$ drain/source implant can be chosen to be higher than any one of 1E15, 2E15, 2.1E15, 2.2E15, 2.3E15, 2.4E15, 2.5E15, 2.6E15, 2.7E15, 2.8E15, 2.9E15, 3E15, 4E15, 4.1E15, 4.2E15, 4.3E15, 4.4E15, 4.5E15, 4.6E15, 4.7E15, 4.8E15, 4.9E15, 5E15, 5.1E15, 5.2E15, 5.3E15, 5.4E15, 5.5E15, 5.6E15, 5.7E15, 5.8E15, 5.9E15, 6E15, 7E15, 8E15, 9E15, 1E16, and 2E16 atoms/cm$^2$ and an n-type counter dopant with a dose to be higher than 1E12 1/cm$^2$. In some embodiments, $BF_2$ is combined with another n-type noise reducing dopant such as $PF_3$, $PF_5$, $AsF_3$, $AsF_5$, $SbF_3$, and $SbF_5$ and their associated ions generated in a plasma.

At 612, method 600 includes forming a gate insulator layer over the plurality of fins. In some embodiments, the gate insulator is formed before implanting the silicon layer using a first noise reducing dopant and/or a second noise reducing dopant.

At 612, method 600 includes forming a gate electrode over the gate insulator layer after implanting the plurality of fins using the first dopant having a first noise reducing species and the second dopant.

In some embodiments, implanting of the first dopant and/or second dopant may be performed during at least one period selected from the group consisting of (a) after forming at least one fin but before forming a gate insulator material, (b) after forming an silicon oxide layer that is part of the gate insulator but before forming further parts of the gate insulator material stack, (c) after having formed the full gate insulator material stack but before forming a gate electrode material, (d) after forming a portion of the gate electrode material stack but before completing the gate electrode material stack, (e) after forming a gate electrode material stack but before forming the gate structure, (f) after forming the gate structure but before forming the gate sidewall spacers, and (g) after forming the gate sidewall spacers. In one or more embodiments, the first dopant and the second dopant may be implanted at any time during the manufacturing process.

In some embodiments, the first dopant and second dopant are implanted into the same partially completed structure. In some embodiments, the partially completed structure where the first dopant is implanted is different from the partially completed structure where the second dopant is implanted. So in general implanting the first dopant and second dopant can be distributed over or spread between different partially completed structures of the semiconductor device summing up the appropriate dosage for noise reduction in the fully completed device. In some embodiments, counter doping may be practiced by implanting an ion from $PF_5$ into to the poly silicon gate material of NMOS and PMOS devices after poly silicon gate material deposition and later counter-doping the PMOS gate with a $BF_2$ ion. In some embodiments counter doping may be performed after etching the gate electrode material and a first dopant may be implanted before forming the spacers and could be applied to the gate stack and halo regions (See FIG. 4A-4C) and the second dopant will be implanted into the gate stack and into the drain and source regions (FIG. 4D) after forming the spacers. In some embodiments, the D/S regions of a PMOS may be pre-amorphousized with an ion of $AsF_5$ or $SbF_5$ and later counter doped with $BF_2$.

In some embodiments, the counter-doping techniques mentioned above may be used in structures including a planar bulk CMOS, a planar SOI, a FIN or a MuGFET device made in a bulk CMOS or SOI technology.

It should be noted that the methods described herein do not have to be executed in the order described, or in any particular order, unless it is otherwise specified that a particular order is required. Moreover, unless otherwise specified, various activities described with respect to the methods identified herein can be executed in repetitive, simultaneous, serial, or parallel fashion.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including", but not limited to . . . ".

The Abstract of the Disclosure is provided to comply with 37 C.F.R. §1.72(b), requiring the abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method of fabricating a silicon based metal oxide semiconductor device, comprising:
    introducing a first dopant into a first partial completion of the device, the first dopant comprising a first noise reducing species, said first dopant lacking $BF_2^+$; and
    introducing a second dopant into a second partial completion of the device, the second dopant and the first dopant being opposite conductivity types, said second dopant lacking $BF_2^+$, wherein the first and the second dopants form a counter-doped region.

2. The method of claim 1, wherein the second dopant includes a second noise reducing species.

3. The method of claim 1, wherein the second dopant lacks a noise reducing species.

4. The method of claim 1, wherein the first dopant and the second dopant are introduced at the same time.

5. The method of claim 1, wherein the first dopant is introduced before the second dopant.

6. The method of claim 1, wherein the second dopant is introduced before the first dopant.

7. The method of claim 1, wherein the first dopant is introduced to a first depth and the second dopant is introduced to a second depth.

8. The method of claim 1, wherein introducing the first dopant and the second dopant includes providing a peak concentration of the non noise reducing portion of the first dopant and the second dopant at about the same depth.

9. The method of claim 1, wherein the first noise reducing species includes at least one of fluorine, chlorine, deuterium, and hydrogen.

10. The method of claim 1, wherein the first dopant includes an n-type material and the second dopant includes a p-type material.

11. The method of claim 1, wherein the first dopant includes a p-type material and the second dopant includes an n-type material.

12. The method of claim 1, wherein introducing the first dopant includes a material selected from the group consisting of $AsF_3$, $AsF_5$, $PF_3$, $PF_5$, $SbF_3$, $SbF_5$ and their associated ions generated in a plasma.

13. The method of claim 1, wherein introducing the first dopant includes $BCl_3$ and/or its associated ions generated in a plasma.

14. The method of claim 1, wherein said first dopant is introduced during at least one period selected from the group consisting of (a) after forming a substrate but before forming a gate insulator material, (b) after forming an silicon oxide layer that is part of the gate insulator but before forming further parts of the gate insulator material stack, (c) after having formed the full gate insulator material stack but before forming a gate electrode material, (d) after forming a portion of the gate electrode material stack but before completing the gate electrode material stack, (e) after forming a gate electrode material stack but before forming the gate structure, (f) after forming the gate structure but before forming the gate sidewall spacers, and (g) after forming the gate sidewall spacers.

15. The method of claim 1, wherein said second dopant is introduced during at least one period selected from the group consisting of (a) after forming a substrate but before forming a gate insulator material, (b) after forming an silicon oxide layer that is part of the gate insulator but before forming further parts of the gate insulator material stack, (c) after having formed the full gate insulator material stack but before forming a gate electrode material, (d) after forming a portion of the gate electrode material stack but before completing the gate electrode material stack, (e) after forming a gate electrode material stack but before forming the gate structure, (f) after forming the gate structure but before forming the gate sidewall spacers, and (g) after forming the gate sidewall spacers.

16. The method of claim 1, wherein said device includes a FinFET device.

17. A method of fabricating a silicon based metal oxide semiconductor device, comprising:

introducing a first dopant into a first partial completion of said device, the first dopant comprising a first noise reducing species; and introducing a second dopant into a second partially completion of said device, the second dopant comprising a second noise reducing species, the first dopant and the second dopant being of opposite conductivity types.

18. The method of claim 17, wherein introducing the first dopant and the second dopant includes providing a peak concentration of the non noise reducing portion of the first dopant and the second dopant at about the same depth.

19. The method of claim 1, wherein the first dopant includes a material selected from the group consisting of $BF_3$, $BCl_3$ and their associated ions generated in a plasma.

20. A method of fabricating a silicon based metal oxide semiconductor device, comprising:

introducing a first dopant with a first dose into a first partial completion of said device, the first dopant comprising a first noise reducing species, said first dopant introduced during at least one period selected from the group consisting of:

a) after forming a substrate but before forming a silicon oxide layer of the gate insulator material, the first dose being greater than 1E13 $1/cm^2$ for a non noise reducing part of the first dopant having a peak concentration at an introduction depth not deeper than 250 nm, b) after forming a silicon oxide layer of the gate insulator material but before forming further parts of the gate insulator material, the first dose being greater than 1E13 $1/cm^2$, c) after forming the full gate insulator material stack but before forming the gate electrode material, the first dose being greater than 1E13 $1/cm^2$, d) after forming a portion of the gate electrode material stack but before completing the gate electrode material stack, the first dose being greater than 1E13 $1/cm^2$, e) after forming a gate electrode material but before forming the gate structure and a first dose greater than 3E15 $1/cm^2$, f) after forming the gate structure but before forming the gate sidewall spacers, the first dose being greater than 4E14 $1/cm^2$ for a dopant forming an extension, g) after forming the gate structure but before forming the gate sidewall spacers, the first dose being greater than 1E13 $1/cm^2$ for a dopant forming the halo, and h) a structure after forming the gate sidewall spacers, the first dose being greater than 4E15 $1/cm^2$; and introducing a second dopant with a second dose into a second partial completion of said device, said second dopant introduced during at least one period selected from the group consisting of:

a) after forming a substrate but before forming a gate insulator material and a second dose greater than 1E12 $1/cm^2$ for a non noise reducing part of the second dopant having a peak concentration at an introduced depth not deeper than 250 nm, b) after forming a silicon oxide layer being part of the gate insulator but before forming further parts of the gate insulator material stack and a second dose greater than 1E12 $1/cm^2$, c) after having formed the full gate insulator material stack but before forming the gate electrode material and a second dose greater than 1E12 $1/cm^2$, d) after forming a portion of the gate electrode material stack but before completing the gate electrode material stack, the second dose being greater than 1E12 $1/cm^2$,
e) after forming a gate electrode material but before forming the gate structure and a second dose is greater than 1E13 $1/cm^2$,
f) after forming the gate structure but before forming the gate sidewall spacers and a second dose greater than 1E13 $1/cm^2$, and
g) after forming the gate sidewall spacers and the second dose greater than 1E13 $1/cm^2$.

* * * * *